United States Patent
Zhang et al.

(10) Patent No.: US 9,978,296 B2
(45) Date of Patent: May 22, 2018

(54) METHOD AND DEVICE FOR DETECTING DEFECT OF DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhengxin Zhang, Beijing (CN); Shuai Xu, Beijing (CN); Jingshan Ma, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 390 days.

(21) Appl. No.: 14/744,434

(22) Filed: Jun. 19, 2015

(65) Prior Publication Data
US 2016/0125776 A1    May 5, 2016

(30) Foreign Application Priority Data
Oct. 30, 2014    (CN) .......................... 2014 1 0601650

(51) Int. Cl.
| | | |
|---|---|---|
| G01R 31/26 | (2014.01) | |
| G09G 3/00 | (2006.01) | |
| G01R 1/04 | (2006.01) | |

(52) U.S. Cl.
CPC ........... G09G 3/006 (2013.01); G01R 1/0416 (2013.01); G09G 2330/10 (2013.01)

(58) Field of Classification Search
CPC ........ G09G 3/006; G09G 3/32; G01R 1/0416; G01R 31/26; G01R 31/308
See application file for complete search history.

(56) References Cited

U.S. PATENT DOCUMENTS

| | | | | |
|---|---|---|---|---|
| 5,546,013 A | * | 8/1996 | Ichioka | .................. G09G 3/006 324/760.02 |
| 7,145,358 B2 | * | 12/2006 | Ando | ..................... G09G 3/006 324/760.01 |
| 9,007,078 B2 | * | 4/2015 | Hsieh | ................. G01R 31/3187 324/750.01 |

FOREIGN PATENT DOCUMENTS

| | | |
|---|---|---|
| CN | 1705096 A | 12/2005 |
| CN | 101672804 A | 3/2010 |

(Continued)

OTHER PUBLICATIONS

First Chinese Office Action dated Oct. 9, 2016; Appln. No. 201410601650.1.

(Continued)

*Primary Examiner* — Minh N Tang
(74) *Attorney, Agent, or Firm* — Ladas & Parry LLP

(57) ABSTRACT

A method and device for detecting a defect of a display panel, the method comprises steps of: connecting at least one electrical test pad on the display panel to a first detecting terminal, and connecting another at least one electrical test pad on the display panel to a second detecting terminal; providing a preset voltage between the first detecting terminal and the second detecting terminal; and, detecting whether magnitudes of currents passing through the first detecting terminal and the second detecting terminal within a predetermined time are less than a preset current threshold, and if not, then determining there is a defect on the display panel. The present disclosure can implement effective detection and interception of a progressive defect or badness in the display panel.

20 Claims, 4 Drawing Sheets

(56) References Cited

FOREIGN PATENT DOCUMENTS

| CN | 102109688 A | 6/2011 |
|---|---|---|
| CN | 102945647 A | 2/2013 |
| CN | 102955097 A | 3/2013 |
| JP | 63186212 A | 8/1988 |

OTHER PUBLICATIONS

The Second Chinese Office Action dated May 2, 2017; Appln. No. 201410601650.1.

* cited by examiner

METHOD AND DEVICE FOR DETECTING DEFECT OF DISPLAY PANEL

FIELD OF THE INVENTION

The embodiment of the present disclosure relates to a method and device for detecting a defect of display panel.

BACKGROUND

Defects or badness generated during display panel manufacturing process are progressive defects or badness, such as electrostatic breakdown due to Electro-Static discharge (ESD) effect or local short circuit due to accidental scratch, etc. Because this kind of defects and badness will not cause a significant impact on the display panel functions in the early formation, and meantime through analysis of these defective products, it is found that the defective points in circuits of most defective display panels can not be obviously observed through a microscope or other visual detection means, it is uneasy to effectively detect this kind of defects or badness both at the time of the out going inspection of the manufacturer and during the customer's system assembly and checking process. For this kind of defects or badness, how to effectively detect and intercept gradually becomes an issue concerned by the manufacturers of the display panels.

SUMMARY OF THE INVENTION

In view of the shortcomings in the prior art, the present disclosure provides a method and device for detecting a defect of a display panel, which can achieve effective detection and interception of progressive defects or badness in the display panel.

In a first aspect, the present disclosure provides a method for detecting a defect of a display panel, comprising steps of:

connecting at least one electrical test pad on the display panel to a first detecting terminal, and connecting another at least one electrical test pad on the display panel to a second detecting terminal;

providing a preset voltage between the first detecting terminal and the second detecting terminal;

detecting whether magnitudes of currents passing through the first detecting terminal and the second detecting terminal within a predetermined time are less than a preset current threshold, and if not, then determining there is a defect on the display panel.

In a second aspect, the present disclosure further provides a device for detecting a defect of a display panel, comprising:

a first detecting terminal and a second detecting terminal for being electrically connected with electrical test pads on the display panel, wherein after the electrical test pads are electrically connected with the first detecting terminal or the second detecting terminal, both the first detecting terminal and the second detecting terminal are electrically connected with at least one electrical test pad;

a voltage providing unit is configured to provide a preset voltage between the first detecting terminal and the second detecting terminal after the electrical test pads are electrically connected with the first detecting terminal or the second detecting terminal;

a detecting unit is configured to, after the voltage providing unit provides the preset voltage between the first detecting terminal and the second detecting terminal, detect whether magnitudes of currents passing through the first detecting terminal and the second detecting terminal within a predetermined time are less than a preset current threshold, and if not, then determine there is a defect on the display panel.

It can be known from the above mentioned solution that the present disclosure ages a defect point possibly existing between circuit parts connected with the two electrical test pads, respectively, by applying a voltage between the two electrical test pads on the display panel, at which time, the possibly existing defect point will be fused into an open circuit, and during which period, the current will have a sudden increasing process, thus it can be known whether there is a defect point between the two circuit parts by determining whether magnitudes of the currents within a predetermined time are lower than a preset current threshold. It can be found through analysis that this approach can effectively intercept this kind of progressive defect or badness, and thus, the present disclosure can implement effective detection and interception of the progressive defect or badness in the display panel.

DETAILED DESCRIPTION OF THE PREFERRED EMBODIMENTS

In order to make the object, technical solution and advantages of the embodiments of the present invention more clear, the technical solution in the embodiments of the present invention will be described clearly and completely in conjunction with drawings in the embodiments of the present invention. Obviously, the described embodiments are a part of the embodiments of the present invention, instead of all the embodiments. Based on the embodiments in the present invention, all other embodiments obtained without creative work by those ordinary skilled in the art belong to the protection scope of the present invention.

It should be indicated in the description of the present invention that, the orientation or location relations indicated by terms "up" and "down" etc. are based on the orientation or location relations indicated by the drawings, are only used for facilitating the simplified description of the present invention instead of indicating or implying the indicated device or element must have special orientation and are constructed or operate in the special orientation, and thus can not be understood as a limitation to the present invention. Unless there is an explicit regulation and limitation, terms "installation", "connection" or "link" should be understood broadly. For example, they can be fixed connections, and can be detachable connections or integral connection; can be mechanical connection, or electrical connection; can be direct connection, or can in indirect connection through an intermediary, and can be a communication between two elements. For those ordinary skilled in the art, they can understand the specific meanings of the above terms in the present invention according to specific situations.

Figure 1:
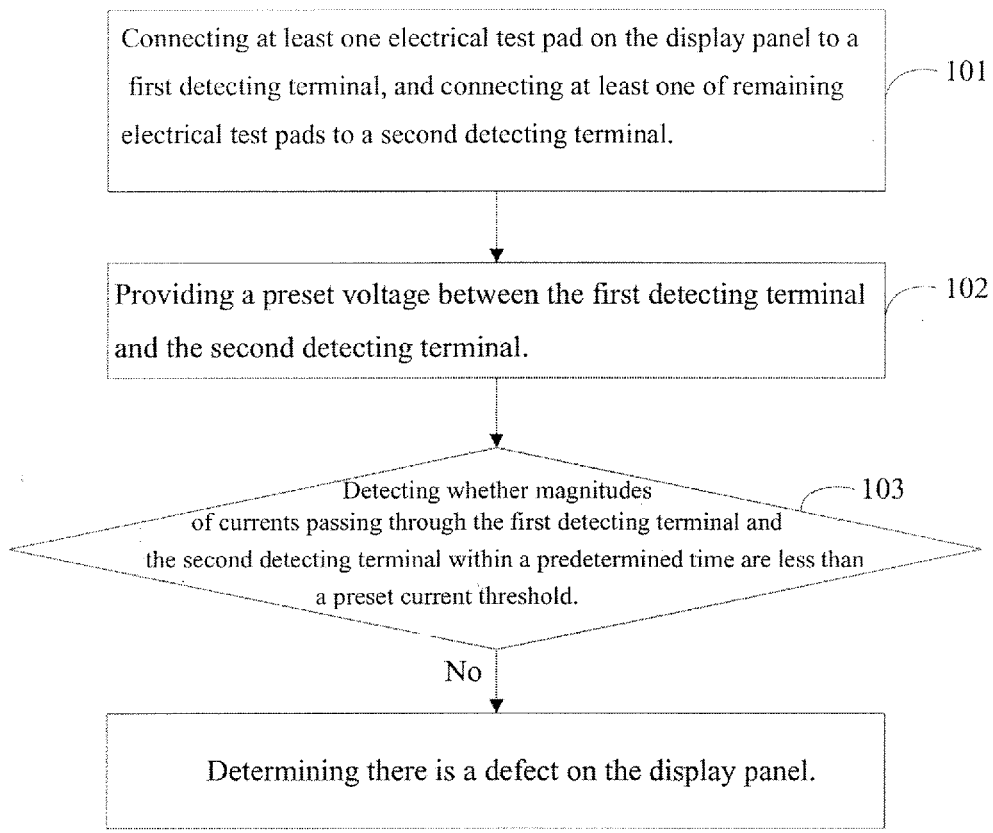
FIG. 1 is a schematic flow chart of a method for detecting a detect in a display panel in an embodiment of the present invention.

FIG. 1 is a schematic flow chart of a method for detecting a defect in a display panel in an embodiment of the present invention, the method comprises:

Step 101: connecting at least one electrical test pad on the display panel to a first detecting terminal, and connecting another at least one electrical test pad on the display panel to a second detecting terminal;

Step 102: providing a preset voltage between the first detecting terminal and the second detecting terminal; and Step 103: detecting whether magnitudes of currents passing through the first detecting terminal and the second detecting terminal within a predetermined time are less than a preset current threshold, and if not, then determining there is a defect on the display panel.

The above mentioned electrical test pads can be electrical test pads located at two sides of a data drive IC of the display panel and/or a gate drive IC of the display panel, and can also be electrical test pads drawn out from any node in the circuit of the display panel, and the present disclosure does not have any limitation thereon. However, for defect detection in the embodiments of the present invention, any two of the used electrical test pads should be insulated from each other (for example, the resistance value therebetween should be not less than 1 MΩ) when the display panel does not have a defect, for example, two electrical test pads can be made to be connected with scanning signal lines corresponding to different lines (they do not have an electrical connection in normal cases).

The manner of providing a preset voltage between the first detecting terminal and the second detecting terminal in step 102 can adopt an adjustable voltage source to supply power, and can also adopt a common voltage dividing circuit to supply power, and the present invention has not limitation thereon. Therein, a preset value of voltage can be set based on the numerical value range of an insulation resistor and a short circuit resistor, which may be around 10V in general.

Thus, when the display panel does not have a defect, in step 101, connecting at least one electrical test pad on the display panel to a first detecting terminal, and connecting another at least one electrical test pad on the display panel to a second detecting terminal are equivalent to at least one resistor having a great resistance value (generally at a megohm level) connected in parallel between the first detecting terminal and the second detecting terminal. After providing a predetermined voltage to the two ends of these resistors according to the operations of steps 102 and 103, the current passing through the first detecting terminal and the second detecting terminal will be kept within a very small numerical range (for example, constantly less than 10 μA), thus a preset current threshold (generally, far greater than the numerical range in value, such as 1 mA) can be set, allowing the panels having no defect to be able to pass the above defect detecting flow normally.

If there is a defect (i.e., the above mentioned progressive defect or badness) on the display panel, which can allow a short circuit existing between the two electrical test pads (for example, the resistance value therebetween is less than 1 kΩ), then when one of the two electrical test pads is connected with the first detecting terminal, and the other is connected with the second detecting terminal, after providing the preset voltage in step 102, a very large current will pass the above short circuit position (it can be known based on Ampere's formula that the current passing a resistor having a resistance less than 1 kΩ under a preset voltage of 10V is at least 10 mA), and the resistor which results in the short circuit is fused instantaneously (for example, in a time less than 10 ms) to make the current return to within a very small numerical range. Even if no fusing occurs, the current will be made far greater than the normal numerical range. Thus, in the process, the magnitude of the current within a predetermined time (which can be 1 s or 2 s) will not be constantly lower than the above preset current threshold (the process of providing a voltage within a predetermined time is an aging process), thus being able to detect there is a defect on the display panel.

Base thereon, if it is detected that there exists a defect on the display panel, then the position of the defect is obviously located between an electrical test pad connected with the first detecting terminal and an electrical test pad connected with the second detecting terminal, and the position of the defect can be located further by way of changing the electrical connecting situation that the electrical test pads and the detecting terminals and detecting again. It can be seen that the method of the embodiments of the present invention can effectively detect the above mentioned progressive defect or badness.

The existing detecting method such as visual detection has a relatively poor detection effect for such kind of defect or badness because it is difficult to directly observe the location where the defect on the display panel appears; in the common electrical detecting method, because the above mentioned voltage applying and fusing process is not realized and it is easy to miss the detection of products having defects, the detection effect that can be achieved by the embodiment of the present invention can not be achieved.

It should be indicated that, the current detection in the above "detecting a current passing through the first detecting terminal and the second detecting terminal" can a direct detection and can also be an indirect detection, for example, adopting a manner of connect a resistor in series to measure a voltage to do the above detection, it is substantially an indirect detection for current, which obviously does not depart from the spirit and scope of the present invention.

In another embodiment of the present invention, the above step 102 comprises: electrically connecting the first detecting terminal to a first terminal of a predetermined resistor, and electrically connecting the second detecting terminal to a second terminal of a predetermined constant voltage source, a second terminal of the predetermined resistor being connected with a first terminal of the predetermined constant voltage source. The predetermined constant voltage source is used for providing a preset voltage between the first detecting terminal and the second detecting terminal under the divided voltage of the predetermined resistor, and meantime the predetermined resistor further plays a role in protecting the predetermined constant voltage source.

Further, indirect measurement of the current passing through the first detecting terminal and the second detecting terminal can be implemented through the predetermined resistor, i.e., the above step 103 comprises: measuring voltage across the predetermined resistor, determining whether magnitudes of the voltages within a predetermined time are less than a product of the current threshold and a resistance value of the predetermined resistor, and if not, then determining there is a defect on the display panel. It is equivalent to, through a known resistance value, a comparison between a circuit current and a current threshold is converted into a comparison between a known voltage across the resistor and a corresponding voltage threshold, and it can also be understood as that the indirect measurement of the current passing through the first detecting terminal and the second detecting terminal can be implemented through a measurement of a voltage across a predetermined resistor (known resistance value).

Alternatively, the above comparison between voltage across a resistor and a corresponding voltage threshold can be implemented through a latch, i.e., the above step 103 comprises: electrically connecting the first detecting terminal to an input terminal of a latch, which is used for maintaining an output of a high level after the voltage at the input terminal is greater than or equal to the product of the current threshold and the resistance value of the predetermined resistor; and, determining whether an output of the latch within a predetermined time is kept at a low level, and if not, then determining there is a defect on the display panel. Because the resistance value of the predetermined resistor is a known one while the current threshold is a preset one, it can be designed that a difference between the level (zero level) of a common terminal of the latch and a high level potential (representing a potential having a logic value of "1") is equal to the product of the resistance value of the above predetermined resistor and the above current threshold. Thus, when the level at the first detecting terminal (i.e., a circuit node between the electrical test pad and the predetermined resistor) at any time reaches the above high level potential, the latch will record the high level potential and continuously output a high level at its output terminal, i.e., it represents that there is a defect on the display panel. Further, the output terminal of the latch can be connected with one terminal of an LED, and the other terminal is grounded or connected with a common terminal, so that the high level output by the latch can be observed directly by people, facilitating proceeding of the detection.

In addition, in another embodiment of the present invention, changing the electrical connection relation between the electrical test pad and the first detecting terminal or the second detecting terminal can be implemented through a switching circuit, i.e., the above step 101 comprises: controlling on or off of a switching element located between each electrical test pad and the first detecting terminal or the second detecting terminal, so as to connect at least one electrical test pad on the display panel to the first detecting terminal, and connect another at least one electrical test pad on the display panel to the second detecting terminal. Therein, the switching element is an element, the connection or disconnection of whose two terminals is controlled by an external control signal, for example, it can be a thin film transistor. For example, a switching element located between electrical test pads can make the two electrical test pad be connected or disconnected with each other, for example, the two electrical test pads can be made to be connected with the first detecting terminal at the same time when the switching element is ON, and only one electrical test pad is connected with the first detecting terminal when the switching element is OFF. The switching element located between the electrical test pad and the first detecting terminal or the second detecting terminal can allow the electrical test pad to be connected or disconnected with first detecting terminal or the second detecting terminal. Of course, there can exist at least one switching element on a path between each electrical test pad and the first detecting terminal or the second detecting terminal, and each electrical test pad can be connected with the first detecting terminal and the second detecting terminal at the same time by at least one switching element. Accordingly, the ON or OFF status of the switching element in the switching circuit can be controlled by an external control signal, thus flexibly setting the electrical connection relation between the electrical test pad and the first detecting terminal or the second detecting terminal, which facilitates the enhancement of the detection efficiency of the display panel.

In order to more clearly describe the technical solution of the present invention, there is provided an embodiment of a device for detecting a defect of a display panel, corresponding to the above any method for detecting a defect of a display panel, the device comprising:

a first detecting terminal and a second detecting terminal for being electrically connected with electrical test pads on the display panel, wherein after the electrical test pads are electrically connected with the first detecting terminal or the second detecting terminal, both the first detecting terminal and the second detecting terminal are electrically connected with at least one electrical test pad;

a voltage providing unit is configured to provide a preset voltage between the first detecting terminal and the second detecting terminal after the electrical test pads are electrically connected with the first detecting terminal or the second detecting terminal;

a detecting unit is configured to, after the voltage providing unit provides the preset voltage between the first detecting terminal and the second detecting terminal, detect whether magnitudes of currents passing through the first detecting terminal and the second detecting terminal within a predetermined time are less than a preset current threshold, and if not, then determine there is a defect on the display panel.

Optionally, the voltage providing unit comprises a predetermined resistor and a predetermined constant voltage source, a second terminal of the predetermined resistor is connected with a first terminal of the predetermined constant voltage source, the first detecting terminal is connected with a first terminal of the predetermined resistor, and the second detecting terminal is connected with a second terminal of the predetermined constant voltage source.

Optionally, the detecting unit comprises: a voltage measuring module configured to measure voltage across the predetermined resistor, and transfer a measurement result to a determining module; and the determining module configured to determine whether magnitudes of the voltages measured by the voltage measuring module within a predetermined time are less than a product of the current threshold and a resistance value of the predetermined resistor, and if not, then determine there is a defect on the display panel.

Optionally, the detecting unit comprises: a latch whose input terminal is connected with the first detecting terminal, configured to maintain an output of a high level after a voltage at the input terminal is greater than or equal to the product of the current threshold and the resistance value of the predetermined resistor; and, a determining module configured to determine whether the output of the latch is kept at a low level within a predetermined time, and if not, then determine there is a defect on the display panel.

Optionally, there is included a switching circuit between the first detecting terminal and the electrical test pad and between the second detecting terminal and the electrical test pad, the switching circuit comprising a switching element provided between the electrical test pad and the first detecting terminal or the second detecting terminal. Of course, there can exist at least one switching element on a path between each electrical test pad and the first detecting terminal or the second detecting terminal, and each electrical test pad can be connected with the first detecting terminal or the second detecting terminal at the same time by at least one switching element.

It can be seen that the device for detecting a defect of a display panel and the above method for detecting a defect of a display panel have corresponding technical features, and can be used for a same technical problem.

Figure 2:
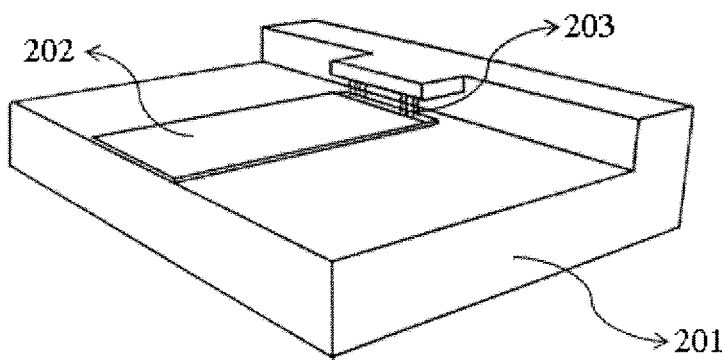
FIG. 2 is a schematic diagram of a outer structure of a device for detecting a detect in a display panel in an embodiment of the present invention.

More specifically, the device can have an outer structure of a device for detecting a defect of a display panel as shown in FIG. 2, wherein:

A base 201 is used for arranging display panel 202 to be detected, a testing probe 203 is used for connecting with the electrical test pads of the display panel 202 (the first and second detecting terminals are used for electrically connecting with the electrical test pads on the display panel through the probe), for acting as an extraction electrode of each electrical test pad. There is arranged a circuit structure including the above switching circuit inside the device, the testing probe 203 is connected with the first detecting terminal and the second detecting terminal inside the device through the structure (at this time, the first and second detecting terminals can be nodes in the circuit specifically). Thus, the above circuit structure including the latch and the predetermined constant voltage source provides the above predetermined voltage between the first and second detecting terminals, and, the above circuit structure including the latch and the predetermined constant voltage source can presents a detection result that can be observed directly by people.

The specific structure and workflow of the above device for detecting a defect of a display panel will be described specifically below by taking a device that can detect four electrical test pads at most at the same time as an example.

Figure 3:
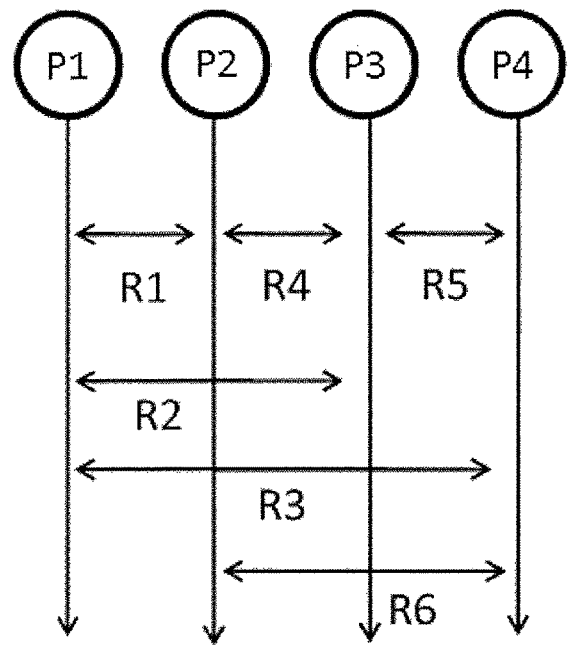
FIG. 3 is a schematic diagram of a resistance distribution between four electrical test pads P1, P2, P3 and P4 in an embodiment of the present invention.

FIG. 3 shows a schematic diagram of a resistance distribution between four electrical test pads P1, P2, P3 and P4. In FIG. 3, the resistance between P1 and P2 is taken as R1 (actually, there is no resistor connected between P1 and P2, R1 herein is only an equivalent resistance, same below), the resistance between P1 and P3 is taken as R2, the resistance between P1 and P4 is taken as R3, the resistance between P2 and P3 is taken as R4, the resistance between P2 and P4 is taken as R6, and the resistance between P3 and P4 is taken as R5.

It can be seen therefrom that, if all the resistance values of R1 to R6 is not less than a certain threshold (such as 1 MΩ), then it is determined that these four electrical test pads P1 to P4 do not have a defect or badness causing short-circuiting therebetween; conversely, if any of R1 to T6, such as R4, has a resistance value less than a certain threshold (such as 1 kΩ), then it can be determined that the display panel has a defect or badness causing short-circuiting therebetween, and the location of the defect or badness is right between P2 and P3.

Figure 4:
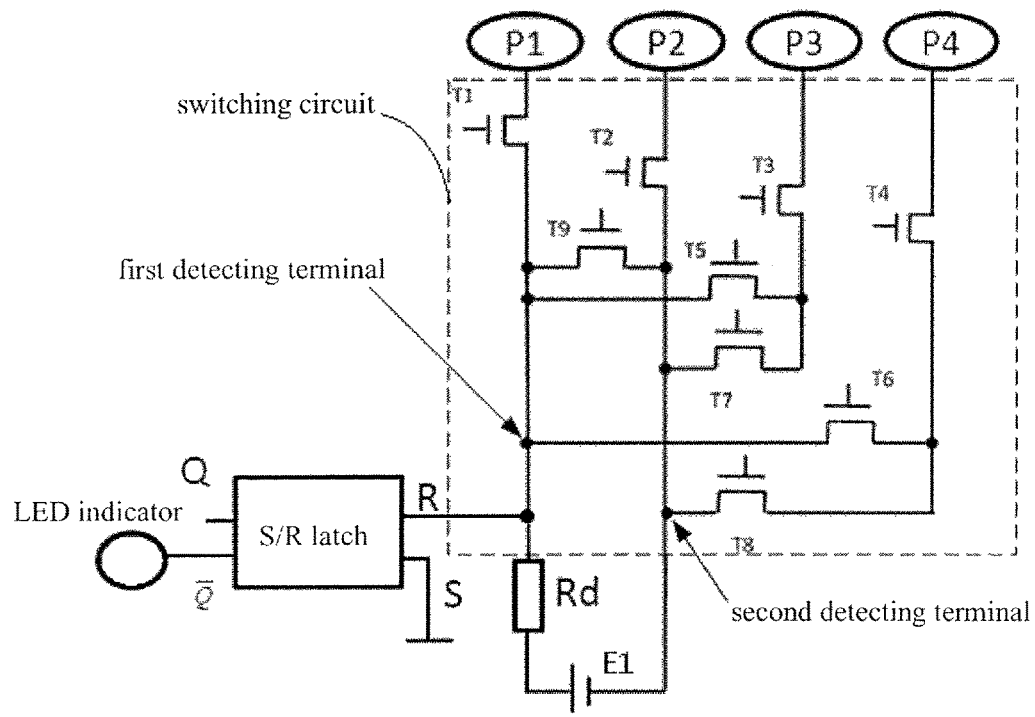
FIG. 4 is a schematic diagram of an internal circuit structure of a device for detecting a detect in a display panel in an embodiment of the present invention.

FIG. 4 shows a schematic diagram of the internal circuit structure of the device, wherein:

Rd is the above predetermined resistor which is connected in series with the circuit part between the first detecting terminal and the second detecting terminal, and the whole circuit is provided a predetermined voltage by a predetermined constant voltage source E1. The input terminal R terminal of an S/R latch is connected with the first detecting terminal, when the R terminal is at a high level (i.e., the logic value is 1), the electrical level difference between the R terminal and the S terminal (connected with a common terminal, and its logic value is constantly 0) is equal to the product of the resistance value of the predetermined resistor Rd and the above current threshold, the true value table of the S/R latch being as follows:

TABLE 1

TRUE VALUE TABLE OF S/R LATCH

| S | R | Q | $\overline{Q}$ | Latch status |
|---|---|---|---|---|
| 0 | 0 | unchanged | unchanged | maintained |
| 0 | 1 | 0 | 1 | 0 |
| 1 | 0 | 1 | 0 | 1 |
| 1 | 1 | 0 | 0 | uncertain |

It can be seen that, when the output terminal R changes from 0 to 1, an output terminal $\overline{Q}$ terminal will changes from 0 to 1 correspondingly; after R terminal change from 1 to 0, $\overline{Q}$ terminal still maintain the output of 1. Thus, within the above predetermined time, as long as the level at the first detecting terminal exceeds a certain range, no matter how long the high level maintains, the SIR latch can record the voltage sudden change and output it. In addition, one terminal of the above LED (the LED indicator in FIG. 4) is connected with the output terminal $\overline{Q}$ of the SIR latch, thus being able to indicate the detection result visually (when $\overline{Q}$ is at a high level, LED illuminates, indicating the display panel has a defect).

Figure 5:
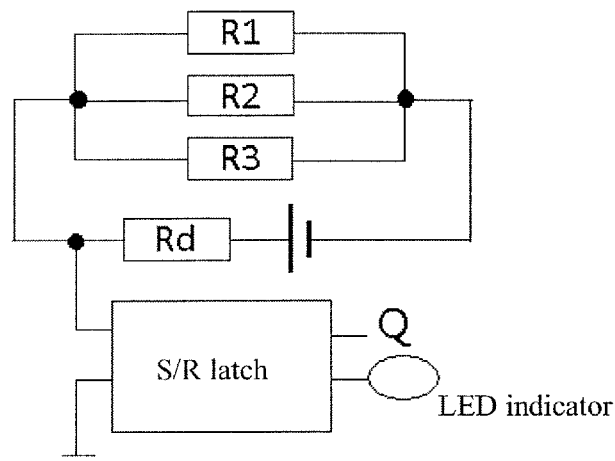
FIG. 5 is an equivalent detecting circuit diagram of a device for detecting a detect in a display panel in an embodiment of the present invention.

The switching circuit part comprises such 9 thin film transistors TFTs T1 to T9, which act as switching elements, wherein each TFT is located between at least one electrical test pad and the first or second detecting terminal. The ON or OFF statutes of these TFTs are controlled by an external control signal connected with the gate. For example, at the time of specific detection, T1, T2, T3, T4, T7, T8 are ON, so as to form an equivalent circuit, wherein R1, R2, R3 is connected in parallel as shown in FIG. 5. When one of R1, R2, and R3 has a defect, there exists a sudden current change after providing the preset voltage, at which time, the voltage at the first detecting terminal increases, and the defect fuses to form an open circuit, thus the current restores into a normal numerical range. According to the current product design, in case of no defect, the display panel has a very great resistance between respective electrical test pads, which is generally at a megohm level, even if a high voltage is applied, the current will also be very small, with no damage to the wiring on the panel; once there is a defect, the resistance value between the electrical test pads reduces, the externally applied high voltage will generate a great current, and the externally applied high voltage will degrade the defect, allowing the resistance to reduce until being fused to form an open circuit.

For example, assuming the resistance value R1 between P1 and P2 is 2 MΩ, when a voltage of 10V is applied between the two pads P1 and P2, the current value is $10/(2\times10^6)=5\times10^{-6}=5$ microampere, and if there is short-circuiting between P1 and P2, the resistance value of R1 will be between 0~1000Ω, at which time, the current will be larger than $10/(1\times10^3)=10$ milliampere, even reaching several hundred milliampere or an Amp level. Because the resistors R1, R2 and R3 are connected in parallel, the resistance value after the connection in parallel will be less than the resistance value of R1 at this time, thus the part of the resistance of R1//R2//R3 ("//" is a parallel connection symbol) reduces, the current of the whole circuit after being connected in series with the resistor Rd increases, the divided voltage of Rd also will increase. The latch will record this increased voltage and continuously output a high level, allowing the LED at the output terminal to illuminate. After fusing to form an open circuit at the defect, only R2//R3 is left to be connected in series with Rd, the current restores to normal again, but the latch will still maintain an high level output, and the LED light will still maintain the illumination status.

If the detection result of R1//R2//R3 is that there is a defect, then it can be provided that only T1 and T2 are ON to detect R1 individually, only T1, T3 and T7 are ON to detect R2 individually, and only T1, T4 and T6 are ON to detect R3 individually, thus further determining the defect location.

Figure 6:
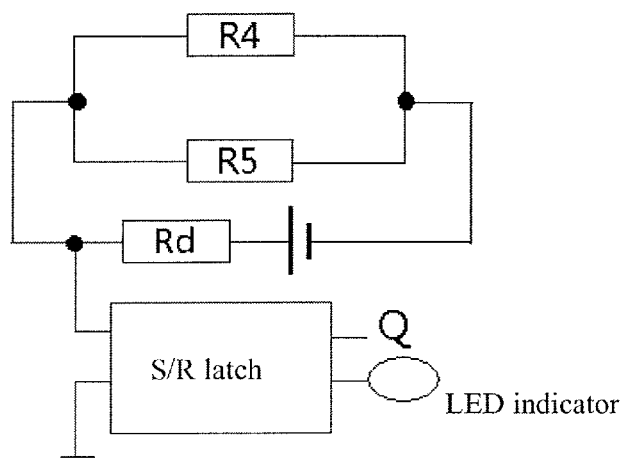
FIG. 6 is an equivalent detecting circuit diagram of a device for detecting a detect in a display panel in an embodiment of the present invention.

If the detection result of R1//R2//R3 is that there is no defect, then it can be provided that only T2, T3, T4, T5 and T8 are ON, forming an equivalent circuit of R4//R5 as shown in FIG. 6, to detect R4 and R5 in a similar flow. If the detection result of R4//R5 is that there is a defect, then it can be provided that only T2, T3 and T5 are ON to detect R4 individually, T3, T4, T5 and T8 are ON or only T3, T4, T6 and T7 are ON to detect R5 individually, thus further determining the defect location.

Figure 7:
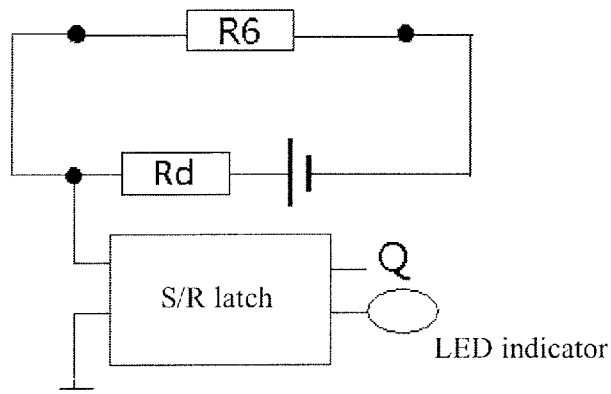
FIG. 7 is an equivalent detecting circuit diagram of a device for detecting a detect in a display panel in an embodiment of the present invention.
Figure 8:
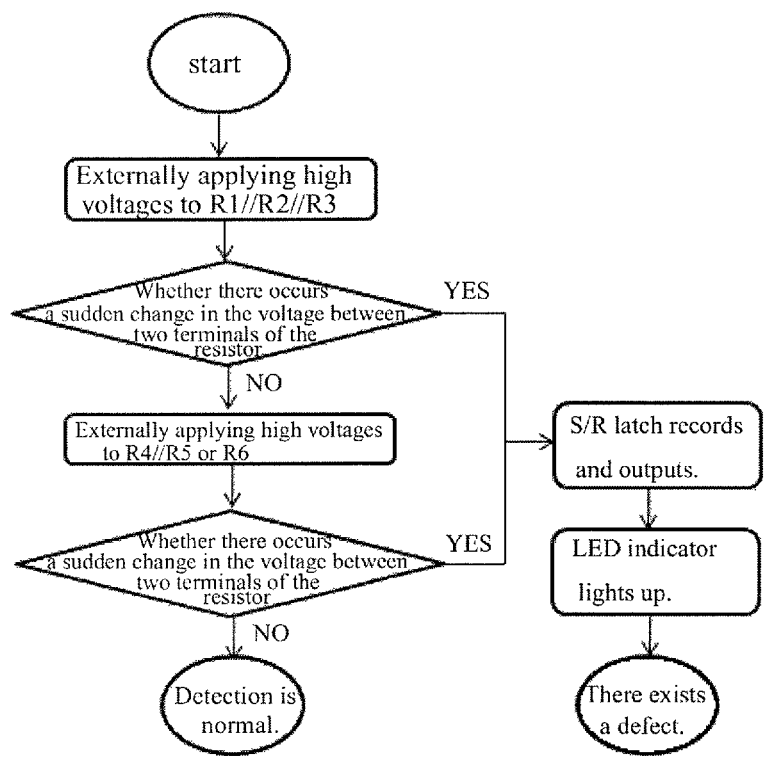
FIG. 8 is a schematic flow chart of a method for detecting a defect in a display panel, corresponding to a device for detecting a defect in a display panel, in an embodiment of the present invention.

If the detection result of R4//R5 is that there is no defect, then it can be provided that only T2, T4, T6 are ON, forming an equivalent circuit as shown in FIG. 7, to detect R6 individually in a similar flow. If the detection result is that there is a defect, then it indicates that there is a defect between P2 and P4 on the display panel; if the detection result is still that there is no defect, then it can be determined that the four electrical test pads P1, P2, P3, P4 have no defect therebetween. The above whole detection flow is as shown in FIG. 8. It can be seen that for other number of electrical test pads, the above embodiment can be referred to design a corresponding circuit, and the above detection flow can be referred to make detection in a similar detection flow.

To summarize, the present disclosure ages a defect point possibly existing between circuit parts connected with the two electrical test pads, respectively, by applying a voltage between the two electrical test pads on the display panel, at which time, the possibly existing defect point will be fused into an open circuit, and during which period, the current will have a sudden increasing process, thus it can be known whether there is a defect point between the two circuit parts by determining whether a magnitude of the current within a predetermined time is lower than a preset current threshold. It can be found through analysis that this approach can effectively intercept this kind of progressive defect or badness, and thus, the present disclosure can implement effective detection and interception of the progressive defect or badness in the display panel.

It should be indicated that, in the present context, relational terms such as first and second, and the like are only used to distinguish one entity or operation from another entity or operation, without necessarily requiring or implying there exist any such actual relation or sequence between these entities and operations. Moreover, the term "comprising", "including" or any other variation thereof, are intended to cover a non-exclusive inclusion, such that the process, method, article or device including a series of factors include not only those elements, but also the other elements not expressly listed, or further includes inherent elements in such process, method, article or device. In the absence of more restrictions, an element defined by the statement "includes a . . . " does not exclude the presence of other elements in the process, method, article or device including the elements.

The above embodiments are merely provided for describing the technical solution of the present invention, but are not intended to limit it; while the present invention has been described in detail with reference to the embodiments, those skilled in the art should appreciate: it is still possible to modify the technical solutions recorded by the previous embodiments, or an equivalent substitution can be made to a part of the technical features therein; while these modifications and substitutions do not make corresponding technical solutions depart from the spirit and scope of the technical solutions of the embodiments of the present invention.

The invention claimed is:

1. A method for detecting a defect of a display panel, it comprises steps of:
   connecting at least one electrical test pad on the display panel to a first detecting terminal, and connecting another at least one electrical test pad on the display panel to a second detecting terminal;
   providing a preset voltage between the first detecting terminal and the second detecting terminal by a voltage providing unit; and
   detecting whether magnitudes of currents passing through the first detecting terminal and the second detecting terminal within a predetermined time are less than a preset current threshold by a detecting unit, and if not, then determining there is a defect on the display panel.

2. The method according to claim 1, wherein, providing the preset voltage between the first detecting terminal and the second detecting terminal by a voltage providing unit comprises:
   electrically connecting the first detecting terminal to a first terminal of a predetermined resistor, and electrically connecting the second detecting terminal to a second terminal of a predetermined constant voltage source, a second terminal of the predetermined resistor being connected with a first terminal of the predetermined constant voltage source.

3. The method according to claim 2, wherein, detecting whether magnitudes of currents passing through the first detecting terminal and the second detecting terminal within the predetermined time are less than the preset current threshold by a detecting unit, and if not, then determining there is a defect on the display panel comprises:
   measuring voltage across the predetermined resistor, determining whether a magnitude of the voltage within a predetermined time is less than a product of the current threshold and a resistance value of the predetermined resistor, and if not, then determining there is a defect on the display panel.

4. The method according to claim 3, wherein, connecting at least one electrical test pad on the display panel to a first detecting terminal, and connecting another at least one electrical test pad on the display panel to a second detecting terminal comprises:
   controlling on or off of a switching element located between each electrical test pad and the first detecting terminal or the second detecting terminal, so as to connect at least one electrical test pad on the display panel to the first detecting terminal, and connect another at least one electrical test pad on the display panel to the second detecting terminal.

5. The method according to claim 2, wherein, detecting whether magnitudes of currents passing through the first detecting terminal and the second detecting terminal within the predetermined time are less than the preset current threshold by a detecting unit, and if not, then determining there is a defect on the display panel comprises:
   electrically connecting the first detecting terminal to an input terminal of a latch, which is configured to maintain an output of a high level after the voltage at the input terminal is greater than or equal to the product of the current threshold and the resistance value of the predetermined resistor; and
   determining whether the output of the latch within a predetermined time is kept at a low level, and if not, then determining there is a defect on the display panel.

6. The method according to claim 5, wherein, connecting at least one electrical test pad on the display panel to a first detecting terminal, and connecting another at least one electrical test pad on the display panel to a second detecting terminal comprises:
   controlling on or off of a switching element located between each electrical test pad and the first detecting terminal or the second detecting terminal, so as to connect at least one electrical test pad on the display panel to the first detecting terminal, and connect another at least one electrical test pad on the display panel to the second detecting terminal.

7. The method according to claim 1, wherein, connecting at least one electrical test pad on the display panel to a first detecting terminal, and connecting another at least one electrical test pad on the display panel to a second detecting terminal comprises:
   controlling on or off of a switching element located between each electrical test pad and the first detecting terminal or the second detecting terminal, so as to connect at least one electrical test pad on the display panel to the first detecting terminal, and connect another at least one electrical test pad on the display panel to the second detecting terminal.

8. A device for detecting a defect of a display panel, comprising:
   a first detecting terminal and a second detecting terminal for being electrically connected with electrical test pads on the display panel, wherein after the electrical test pads are electrically connected with the first detecting terminal or the second detecting terminal, both the first detecting terminal and the second detecting terminal are electrically connected with at least one electrical test pad;
   a voltage providing unit configured to provide a preset voltage between the first detecting terminal and the second detecting terminal after the electrical test pads are electrically connected with the first detecting terminal or the second detecting terminal;
   a detecting unit configured to, after the voltage providing unit provides the preset voltage between the first detecting terminal and the second detecting terminal, detect whether magnitudes of currents passing through the first detecting terminal and the second detecting terminal within a predetermined time are less than a preset current threshold, and if not, then determining there is a defect on the display panel.

9. The device according to claim 8, wherein, the voltage providing unit comprises a predetermined resistor and a predetermined constant voltage source, a second terminal of the predetermined resistor is connected with a first terminal of the predetermined constant voltage source; and
   the first detecting terminal is connected with a first terminal of the predetermined resistor, and the second detecting terminal is connected with a second terminal of the predetermined constant voltage source.

10. The device according to claim 9, wherein, the detecting unit comprises:
    a means for measuring voltage across the predetermined resistor; and
    a means for determining whether a magnitude of the voltage within a predetermined time is less than a product of the current threshold and a resistance value of the predetermined resistor, and if not, and then determining there is a defect on the display panel.

11. The device according to claim 9, wherein, the detecting unit comprises:
    a latch whose input terminal is connected with the first detecting terminal, configured to maintain an output of a high level after a voltage at the input terminal is greater than or equal to the product of the current threshold and the resistance value of the predetermined resistor; and
    a means for determining whether the output of the latch is kept at a low level within a predetermined time, and if not, and then determining there is a defect on the display panel.

12. The device according to claim 9, wherein, there is included a switching circuit between the first detecting terminal and the electrical test pad and between the second detecting terminal and the electrical test pad, the switching circuit comprising:
    a switching element provided between the electrical test pad and the first detecting terminal or the second detecting terminal.

13. The device according to claim 9, the device further comprises a probe connected with the electrical test pad, wherein the first detecting terminal and the second detecting terminal are used for being connected with the electrical test pad on the display panel through the probe.

14. The device according to claim 8, wherein, there is included a switching circuit between the first detecting terminal and the electrical test pad and between the second detecting terminal and the electrical test pad, the switching circuit comprising:
    a switching element provided between the electrical test pad and the first detecting terminal or the second detecting terminal.

15. The device according to claim 8, the device further comprises a probe connected with the electrical test pad, wherein the first detecting terminal and the second detecting terminal are used for being connected with the electrical test pad on the display panel through the probe.

16. A non-transitory computer-readable recording medium having embodied thereon a computer program to execute the following steps:
    connecting at least one electrical test pad on the display panel to a first detecting terminal, and connecting another at least one electrical test pad on the display panel to a second detecting terminal;
    providing a preset voltage between the first detecting terminal and the second detecting terminal by a voltage providing unit; and
    detecting whether magnitudes of currents passing through the first detecting terminal and the second detecting terminal within a predetermined time are less than a preset current threshold by a detecting unit, and if not, then determining there is a defect on the display panel.

17. The non-transitory computer-readable recording medium according to claim 16, wherein, providing the preset voltage between the first detecting terminal and the second detecting terminal by a voltage providing unit comprises:
- electrically connecting the first detecting terminal to a first terminal of a predetermined resistor, and electrically connecting the second detecting terminal to a second terminal of a predetermined constant voltage source, a second terminal of the predetermined resistor being connected with a first terminal of the predetermined constant voltage source.

18. The non-transitory computer-readable recording medium according to claim 17, wherein, detecting whether magnitudes of currents passing through the first detecting terminal and the second detecting terminal within the predetermined time are less than the preset current threshold by a detecting unit, and if not, then determining there is a defect on the display panel comprises:
- measuring voltage across the predetermined resistor, determining whether a magnitude of the voltage within a predetermined time is less than a product of the current threshold and a resistance value of the predetermined resistor, and if not, then determining there is a defect on the display panel.

19. The non-transitory computer-readable recording medium according to claim 17, wherein, detecting whether magnitudes of currents passing through the first detecting terminal and the second detecting terminal within the predetermined time are less than the preset current threshold by a detecting unit, and if not, then determining there is a defect on the display panel comprises:
- electrically connecting the first detecting terminal to an input terminal of a latch, which is configured to maintain an output of a high level after the voltage at the input terminal is greater than or equal to the product of the current threshold and the resistance value of the predetermined resistor; and
- determining whether the output of the latch within a predetermined time is kept at a low level, and if not, then determining there is a defect on the display panel.

20. The non-transitory computer-readable recording medium according to claim 16, wherein, connecting at least one electrical test pad on the display panel to a first detecting terminal, and connecting another at least one electrical test pad on the display panel to a second detecting terminal comprises:
- controlling on or off of a switching element located between each electrical test pad and the first detecting terminal or the second detecting terminal, so as to connect at least one electrical test pad on the display panel to the first detecting terminal, and connect another at least one electrical test pad on the display panel to the second detecting terminal.

* * * * *